(12) United States Patent
Beatty et al.

(10) Patent No.: US 11,061,092 B1
(45) Date of Patent: Jul. 13, 2021

(54) DYNAMIC $B_0$ SHIMMING FOR IMPROVED FAT SATURATION IN MAGNETIC RESONANCE IMAGING (MRI)

(71) Applicant: SYNAPTIVE MEDICAL INC., Toronto (CA)

(72) Inventors: Philip J. Beatty, Toronto (CA); Chad Tyler Harris, Toronto (CA); Curtis Nathan Weins, Toronto (CA)

(73) Assignee: Synaptive Medical Inc., Toronto (CA)

( * ) Notice: Subject to any disclaimer, the term of this patent is extended or adjusted under 35 U.S.C. 154(b) by 0 days.

(21) Appl. No.: 16/736,663

(22) Filed: Jan. 7, 2020

(51) Int. Cl.
 *G01V 3/00* (2006.01)
 *G01R 33/3875* (2006.01)
 *G01R 33/48* (2006.01)

(52) U.S. Cl.
 CPC ..... *G01R 33/3875* (2013.01); *G01R 33/4828* (2013.01)

(58) Field of Classification Search
 CPC .............. G01R 33/543; G01R 33/5659; G01R 33/3415; G01R 33/36; A61B 5/055
 USPC ......................................................... 324/309
 See application file for complete search history.

*Primary Examiner* — Walter L Lindsay, Jr.
*Assistant Examiner* — Frederick Wenderoth
(74) *Attorney, Agent, or Firm* — Fish & Richardson P.C.

(57) ABSTRACT

A fat saturation method for a magnetic resonance imaging system having a main magnet providing a magnetic field $B_0$. The method includes: driving a shim coil assembly with a first set of shimming currents to sufficiently alter a $B_0$ field inhomogeneity of the magnetic field $B_0$ within a region that includes a first imaging volume of interest such that water saturation inside the region is reduced from before the first set of shimming currents are applied; applying a fat saturation pulse to the region; identifying the first imaging volume of interest from the region; driving the shim coil assembly with a second set of shimming currents to alter the $B_0$ field inhomogeneity of the magnetic field $B_0$ within the first imaging volume of interest such that the $B_0$ field inhomogeneity within the first imaging volume of interest is reduced; and obtaining magnetic resonance signals from the first imaging volume of interest.

20 Claims, 7 Drawing Sheets

DYNAMIC $B_0$ SHIMMING FOR IMPROVED FAT SATURATION IN MAGNETIC RESONANCE IMAGING (MRI)

BACKGROUND

The present specification relates to magnetic resonance imaging.

SUMMARY

In one aspect, some implementations provide a method to perform fat saturation on a magnetic resonance imaging (MRI) system having a main magnet providing a magnetic field $B_0$. The method includes driving a shim coil assembly of the MRI system with a first set of shimming currents to sufficiently alter a $B_0$ field inhomogeneity of the magnetic field $B_0$ within a region that includes a first imaging volume of interest such that water saturation inside the region is reduced from before the first set of shimming currents are applied; applying a fat saturation pulse to the region; identifying the first imaging volume of interest from the region; driving the shim coil assembly of the MRI system with a second set of shimming currents to alter the $B_0$ field inhomogeneity of the magnetic field $B_0$ within the first imaging volume of interest such that the $B_0$ field inhomogeneity within the first imaging volume of interest is reduced from before the second set of shimming currents were applied; and obtaining magnetic resonance (MR) signals from the first imaging volume of interest using an imaging pulse sequence.

Implementations may include one or more of the following features.

Obtaining magnetic resonance (MR) signals from the first imaging volume of interest may include: applying gradient pulses to encode MR signals from the first imaging volume of interest; and in response to the gradient pulses, acquiring the MR signals from the first imaging volume of interest.

The imaging pulse sequence may include at least one of: a gradient-echo pulse sequence, a spin-echo pulse sequence, a steady-state free precession (SSFP) pulse sequence, and an echo-planar imaging (EPI) pulse sequence.

Driving the shim coil of the MRI system with a first set of shimming currents may include: driving the shim coil of the MRI system with a first set of shimming currents to substantially minimize water saturation within the region and maximizing fat saturation inside the first imaging volume of interest. Driving the shim coil assembly of the MRI system with a first set of shimming currents may include: driving the shim coil assembly of the MRI system to substantially minimize water saturation throughout the region.

The method may further include: identifying a second imaging volume of interest from the region where fat saturation has been applied; subsequently driving the shim coil of the MRI system with a third set of shimming currents to alter the $B_0$ field inhomogeneity of the magnetic field $B_0$ within the second imaging volume of interest such that the $B_0$ field inhomogeneity within the second imaging volume of interest is reduced from before the third set of shimming currents were applied; and obtaining magnetic resonance signals from the second imaging volume of interest using the imaging pulse sequence.

The method may further include: placing a subject in the main magnet such that the region covers a portion of the subject. The portion of the subject may include at least one of: an abdominal organ of the subject, a breast of the subject, a neck of the subject, an extremity of the subject, and a head of the subject.

Prior to obtaining the MR signals from the first imaging volume of interest: applying a first slice-select gradient while applying a first radio-frequency (RF) pulse such that protons from the first imaging volume of interest are excited by the first RF pulse.

Some implementations provide a magnetic resonance imaging (MRI) system that includes: a main magnet providing a magnetic field $B_0$; a shim coil assembly; a gradient coil assembly; a radio-frequency (RF) coil; a controller in communication with the shim coil assembly, the gradient coil assembly, and the RF coil. The controller configured to perform operations of: driving the shim coil assembly of the MRI system with a first set of shimming currents to sufficiently alter a $B_0$ field inhomogeneity of the magnetic field $B_0$ within a region that includes a first imaging volume of interest such that water saturation inside the region is reduced from before the first set of shimming currents are applied; applying a fat saturation pulse to the region; identifying the first imaging volume of interest from the region; driving the shim coil assembly of the MRI system with a second set of shimming currents to alter the $B_0$ field inhomogeneity of the magnetic field $B_0$ within the first imaging volume of interest such that the $B_0$ field inhomogeneity within the first imaging volume of interest is reduced from before the second set of shimming currents were applied; and obtaining magnetic resonance (MR) signals from the first imaging volume of interest using an imaging pulse sequence.

Obtaining magnetic resonance signals from the first imaging volume of interest may include: applying gradient pulses to encode MR signals from the first imaging volume of interest; and in response to the gradient pulses, acquiring the MR signals from the first imaging volume of interest.

The imaging pulse sequence may include at least one of: a gradient-echo pulse sequence, a spin-echo pulse sequence, a steady-state free precession (SSFP) pulse sequence, and an echo-planar imaging (EPI) pulse sequence.

Driving the shim coil assembly of the MRI system with a first set of shimming currents may include: driving the shim coil of the MRI system with a first set of shimming currents to substantially minimize water saturation within the region.

The operations may further include: identifying a second imaging volume of interest from the region; subsequently driving the shim coil assembly of the MRI system with a third set of shimming currents to alter the $B_0$ field inhomogeneity of the magnetic field $B_0$ within the second imaging volume of interest such that the $B_0$ field inhomogeneity within the second imaging volume of interest is reduced from before the third set of shimming currents were applied; and obtaining magnetic resonance signals from the second imaging volume of interest using the imaging pulse sequence.

The region may cover a portion of a subject placed in the main magnet. The portion of the subject may include at least one of: an abdominal organ of the subject, a breast of the subject, a neck of the subject, an extremity of the subject, and a head of the subject.

Prior to obtaining the MR signals from the first imaging volume of interest: applying a first slice-select gradient while applying a first radio-frequency (RF) pulse such that protons from the first imaging volume of interest are excited by the first RF pulse.

Some implementations provide a method to compute sets of shimming currents for a magnetic resonance imaging (MRI) system having a main magnet that provides a magnetic field $B_0$. The method includes: obtaining a field map of a portion of the magnetic field $B_0$; obtaining a fat map of a portion of a subject placed in the main magnet; obtaining a water map of the portion of the subject placed in the main magnet; based on the field map, the fat map, and the water map, computing values of a first set of shimming currents that substantially minimize water saturation within a region that covers the portion of the subject; obtaining location information of a first imaging volume of interest, the first imaging volume of interest included by the region; and based on the field map, the fat map, the water map, and the location information of the first imaging volume of interest, computing values of a second set of shimming currents that substantially minimize the magnetic field inhomogeneity within the first imaging volume of interest.

Implementations may include one or more of the following features.

The first set of shimming currents may substantially maximize fat saturation within the region that covers the portion of the subject.

The details of one or more aspects of the subject matter described in this specification are set forth in the accompanying drawings and the description below.

Other features, aspects, and advantages of the subject matter will become apparent from the description, the drawings, and the claims.

BRIEF DESCRIPTION OF THE DRAWINGS

Like reference symbols in the various drawings indicate like elements.

DETAILED DESCRIPTION

Figure 1A:
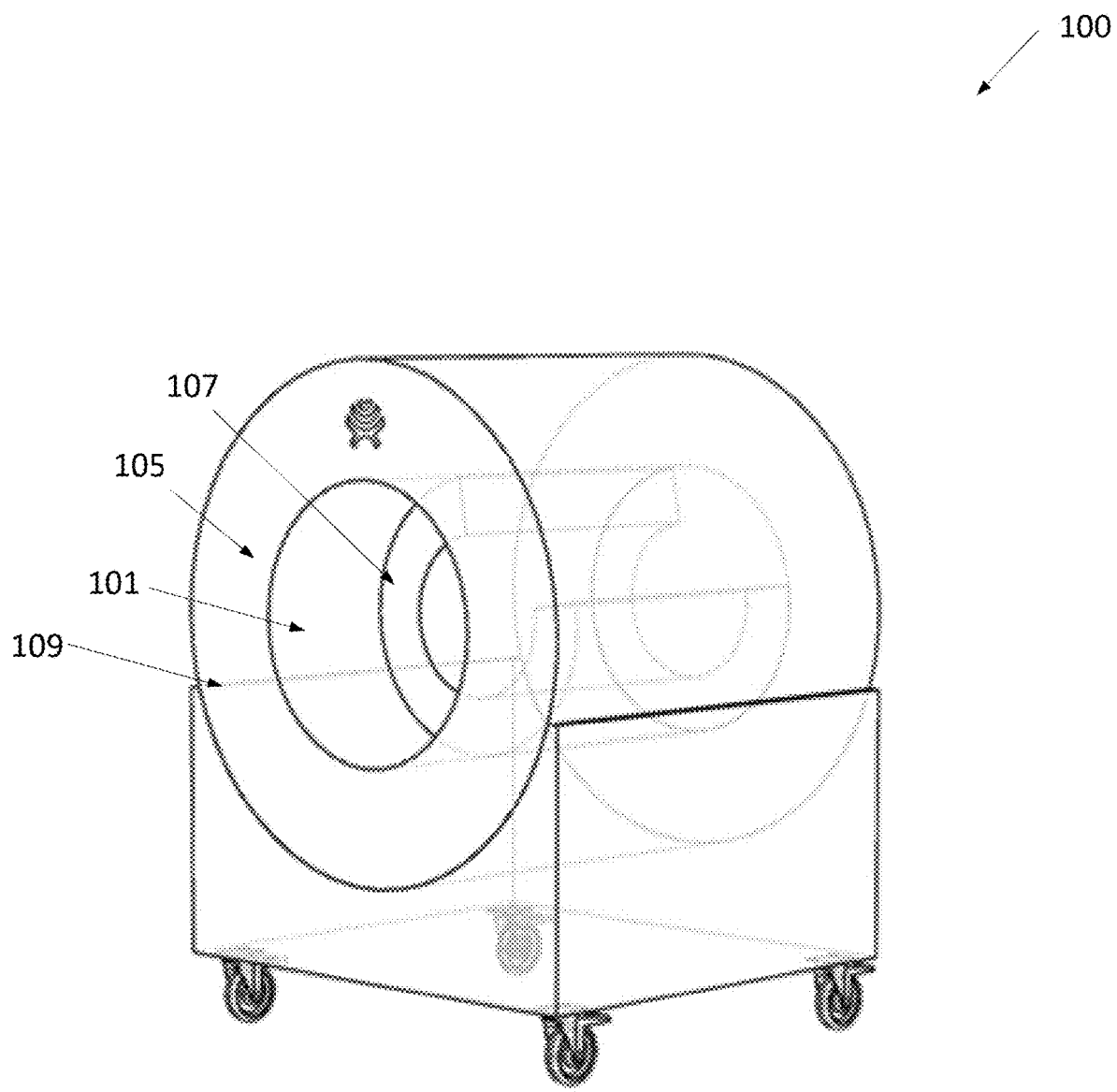
FIGS. 1A to 1B illustrate an example of an apparatus for performing magnetic resonance imaging (MRI).

Various embodiments and aspects of the specification will be described with reference to details discussed below. The following description and drawings are illustrative of the specification and are not to be construed as limiting the specification. Numerous specific details are described to provide a thorough understanding of various embodiments of the present specification. However, in certain instances, well-known or conventional details are not described in order to provide a concise discussion of embodiments of the present specification.

Magnetic resonance (MR) imaging based on proton resonance can provide excellent soft tissue contrast. However, protons from fat tissue and water molecules (in non-fat tissue) experience slightly different (for example, 3.5 ppm) resonant frequencies in a magnetic field. Fat saturation methods can suppress fat signals, thereby improving MR image quality for various applications. Indeed, fat saturation can be added to many MR sequences with minimal increase in scan time and minimal reduction in signal to noise ratio (SNR). However, FatSat can be more challenging at lower field, where the resonant frequencies of fat and water are closer together. This can result in unrealistically long spectrally selective excitation pulses or an intractable problem when the $B_0$ field cannot be sufficiently shimmed. As noted, the peak corresponding to fat proton is about 3.5 ppm away from the water proton. In comparison, a volume of interest can have, for example, 10 ppm $B_0$ variation. To use this volume for MR imaging, the frequency range for suppressing all of the fat signal would overlap with the range for the water signal, rendering it impractical to excite one but not the other.

The present specification discusses a system and method to dynamically change shimming currents to adjust $B_0$ inhomogeneity. A first set of shimming currents can be used to achieve a first adjustment of $B_0$ inhomogeneity for preparing the entire volume or slab for MR imaging. For the purpose of fat saturation, this first set of shimming currents may reduce the amount of water excitation during fat saturation preparation when spectrally selective fat excitations are applied to the entire volume or slab. For example, the number of water protons excited within the entire volume or slab can be minimized while the number of fat protons excited within the entire volume or slab can be maximized as an objective function for an optimization procedure. After signal preparation, a second set of shimming currents can be used to achieve a second adjustment of $B_0$ inhomogeneity. This second set of shimming currents may reduce the overall magnetic field inhomogeneities within the volume of interest for high performance imaging.

In slice-by-slice imaging, it is sufficient to excite (and saturate) the fat signals in each slice separately before acquiring imaging data on that slice. However, if water signal is excited and saturated in another slice in the imaging volume, such saturation could degrade image quality. Indeed, for each imaging slice for subsequent slice-by-slice imaging, a different set of shimming currents can be used to assert a specific adjustment of $B_0$ inhomogeneity for a particular slice when the particular slice is being selected. For example, the new set of shimming currents may be set to maximize the number of in-plane voxels with fat that are in the excitation frequency range, while minimizing the number of water voxels in the coverage volume that are in the excitation frequency range. Similar to the single volume of interest case described previously, a second set of shimming currents for each slice/slab may be applied during the acquisition process so as to minimize field inhomogeneity for that particular slice/slab.

Figure 1B:
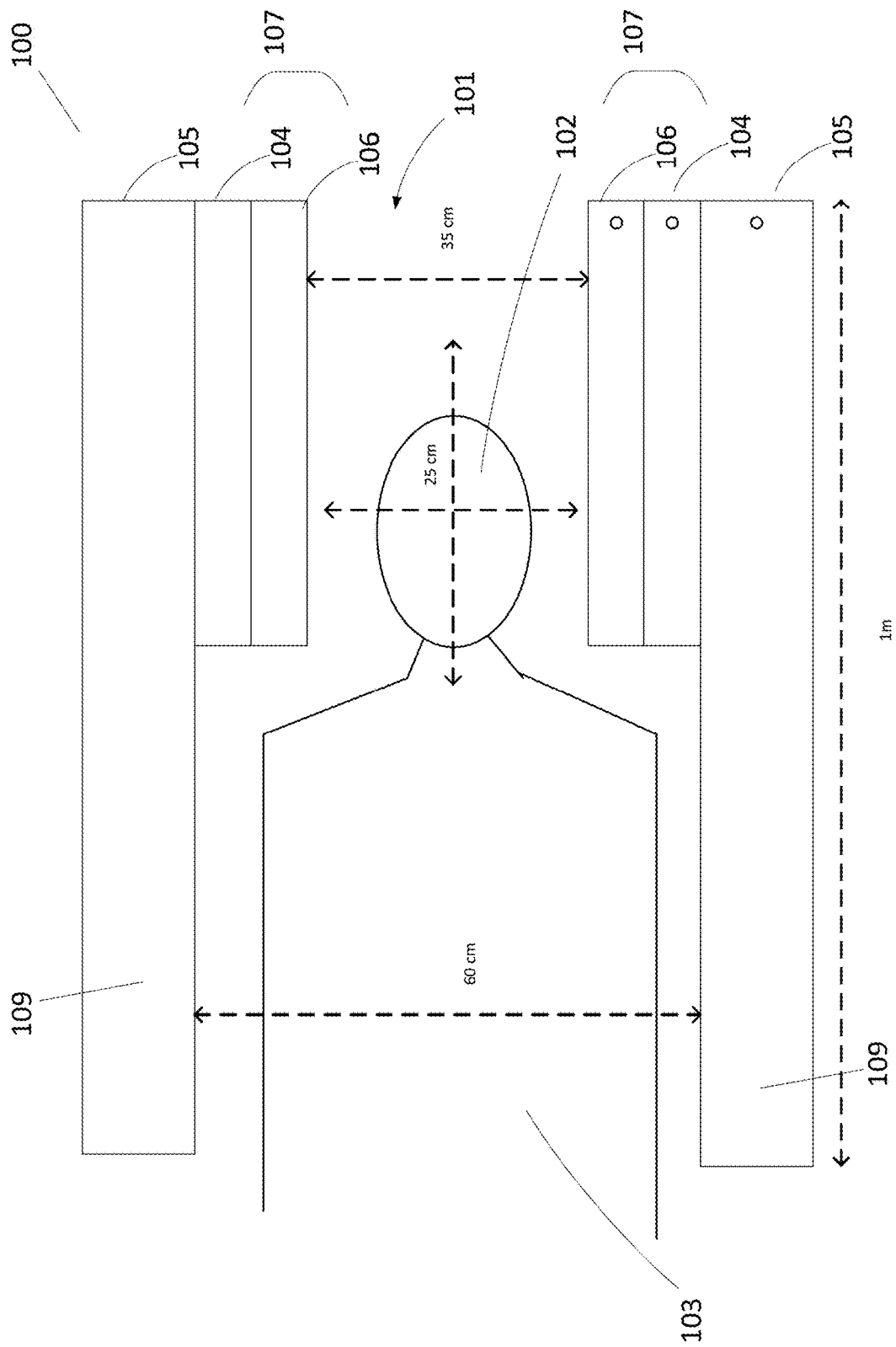

FIGS. 1A-1B show a perspective view and a cross-sectional view of an example of a magnetic resonance imaging (MRI) system 100 in which a solenoid magnet 105 is provided in a cylindrical shape with an inner bore 101. Coil assembly 107, including transmit coil 106 and gradient coil 104, is provided within solenoid magnet 105. Coil assembly 107 may generally be shaped as an annular structure and housed within the inner bore of solenoid magnet 105. In some implementations, annular coil assembly 107 only includes gradient coil 104. Gradient coil 104 generally provides field gradients in more than one directions, such as, for example, all three orthogonal spatial directions. Thus, gradient coil 104 may refer to three sets of coils, each configured to generate field fluctuations in a respective direction for the main field in the inner bore of the solenoid magnet 105. Such field fluctuations may cause magnetizations from various spatial locations to experience precessions at different frequencies, enabling encoding of spatial information of the magnetizations through RF excitation pulses.

In these implementations, annular coil assembly does not include transmit coil 106 or any receiver coil. For these implementations, radio-frequency (RF) excitation pulses are, for example, transmitted by local coils for imaging the head region 102 of patient 103. In one instance, a head coil in a birdcage configuration is used for both transmitting RF excitation pulses and receiving MR signals for imaging the subject. In another instance, a birdcage coil is used as a transmit coil and a local coil (such as a surface coil) is used as a receiver coil. In yet another instance, a surface coil is used for transmitting an RF excitation pulse into the subject and a phased array coil configuration is used for receiving MR signals in response. The MRI system 100 can be used to scan various portions of a subject, for example, an abdominal organ of the subject, a breast of the subject, a neck of the subject, an extremity of the subject, and a head of the subject.

In some implementations, shim coil assembly 109 are housed within the gradient coil assembly 104. Shim coil assembly 109 may include one or more of shim coils. Shim coil assembly 109 may be powered by a group of power amplifiers. In some cases, the power amplifiers are housed in a control room and are connected to shim coil assembly 109 to provide shimming of the magnetic field within inner bore 101. In driving shim coil assembly 109, power amplifiers may be controlled by a control unit that generally includes one or more processors as well as programming logic to configure the power amplifiers. In some instances, the control unit is housed in a control room separate from the solenoid magnet 105 of the MRI system 100. Further, shim coil assembly 109 may not require active cooling using circulating coolant. In these implementations, an array of shimming coils can be used to provide adjustment to the field strength within the inner bore 101 such that the magnet field within the inner bore 101 becomes more homogenous.

The embodiments provided in this present specification allows the operation of multiple RF coils inside an MR magnet. As described earlier in this specification, an RF coil is a resonant structure used to either excite the sample, receive signals from the sample, or perform a combination of both functions during a magnetic resonance imaging (MRI) acquisition. When operating an RF coil in the presence of additional RF circuitry, for example, a close-fitting "receive-only coil," the RF coil can be switched "off" and "on" for two reasons. During transmission, a resonating structure located between the transmit coil and the sample results in a distortion of the transmit field and a reduction in efficiency. Additionally, transmit coils operate at power levels that far exceeds the range of receive-only circuits. For illustration, if such transmit coils are coupled to the receive-only coils, the power level during transmit events can destroy the low-power receive-only circuitry. During reception, the presence of any additional resonating structures in the vicinity of the receive-only RF coil results in signal degradation and an increase in overall system noise.

In this context, transmit coil 106, as an example of a radio frequency (RF) coil, can be switched "on" and "off" during transmit and receive operations. RF coils can be configured in an array for performing excitation, receiving signals or a combination of both functions. Arrays designed for signal excitation are known as "transmit coils." Arrays designed for signal reception are known as "receive coils." Arrays designed for both functions are known as "transceive coils." Generally, RF arrays are composed of multiple resonating antennae that are disposed in a judicious manner about the imaging region such that: (i) efficiency can be maximized during transmission, (ii) the magnitude of the received signal can be maximized during reception (signal-to-noise ratio or 'SNR'), and (iii) a combination of both.

Figure 2A:
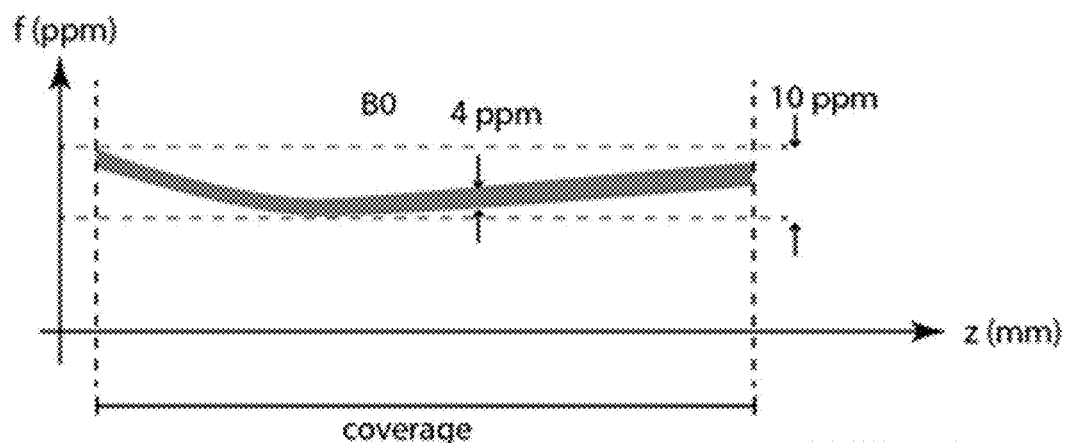
FIGS. 2A to 2C illustrate examples of shimming for a volume of coverage and slice selection when both fat and water signals are present.
Figure 2B:
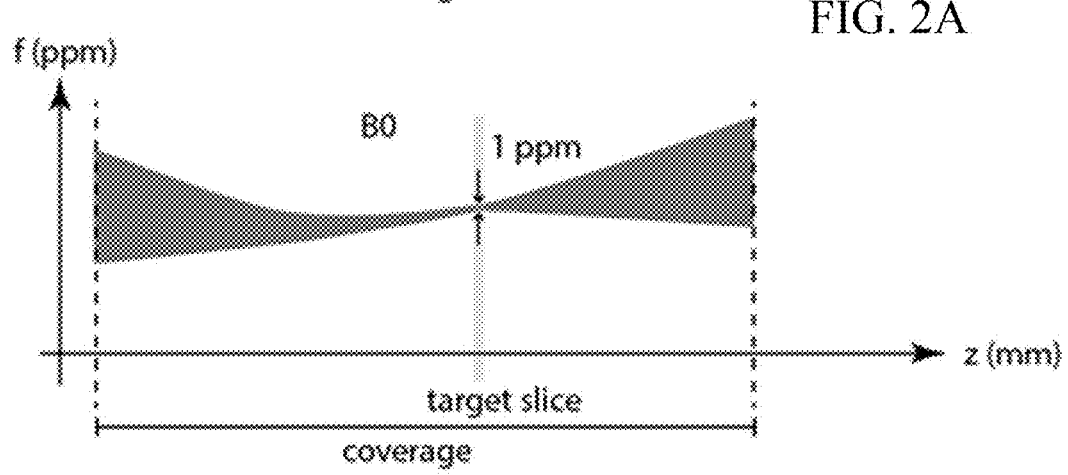
Figure 2C:
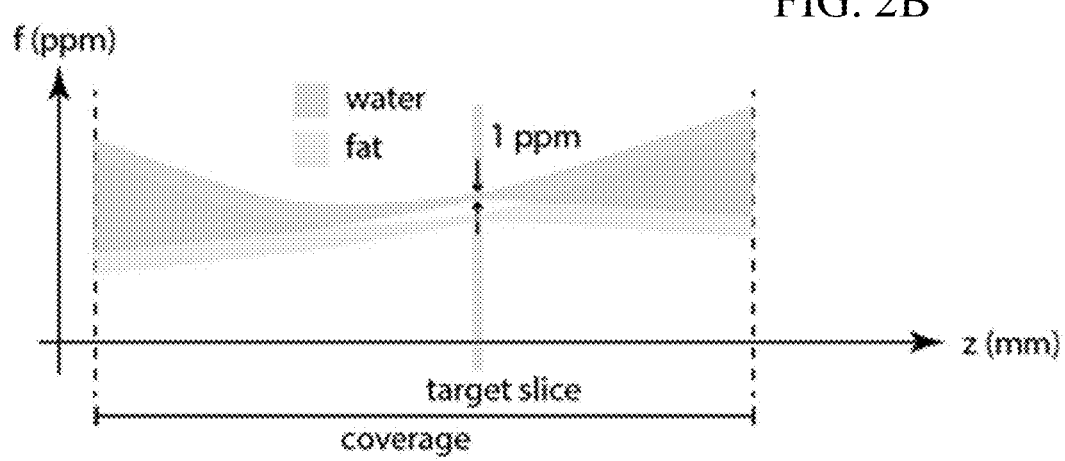

FIGS. 2A to 2C illustrate examples of shimming for a volume of coverage and slice selection when both fat and water signals are present. Initially, FIG. 2A shows a profile of $B_0$ inhomogeneity as a function of slice location (along a z direction in, for example, inner bore 101 of the magnet of MRI system 100) across the region (for example, head region 102 of patient 103 for imaging). The vertical axis corresponds to a frequency offset measured in parts per million (ppm). The offset is with regard to the Larmor frequency at a specific field strength. The horizontal axis corresponds to a spatial measure of the volume (for example, in the z direction that covers the target slice location). The shade height at each horizontal location indicates a spread of the frequency offset within a slice at the particular horizontal location. As illustrated, $B_0$ varies by approximately 10 ppm over the entire coverage region, but can be less (for example, 4 ppm) at the specific target location. $B_0$ inhomogeneity can be altered by adjusting shimming current that run through shim coils (for example, shim coil assembly 109 outside the inner bore 101). In some cases, shim coil assembly 109 can provide corrections (such as high order harmonics correction) to alter $B_0$ inhomogeneity. FIG. 2B shows an example of a profile of $B_0$ inhomogeneity after programming the currents that run through shim coils to minimize the $B_0$ inhomogeneity over the specified target slice. The $B_0$ inhomogeneity across the specific target slice is reduced to about 1 ppm. However, the shimming also gives rise to increased $B_0$ inhomogeneity outside of the target slice. To appreciate the effect at the target location and throughout the region, FIG. 2C shows a plot of resonant frequency offset for both water and fat chemical species. In this illustration, water and fat species are separated into distinct frequency bands over the target slice (where the $B_0$ inhomogeneity has been reduced to 1 ppm); but their frequency bands overlap outside of the target slice. This newly introduced overlap outside the target slice can impose unintended water saturation during, for example, a multi-slice image acquisition when the fat saturation preparation pulses burn out substantial water signals of a particular slice when neighboring slices are being prepared for image acquisition, as explained below.

Figure 3A:
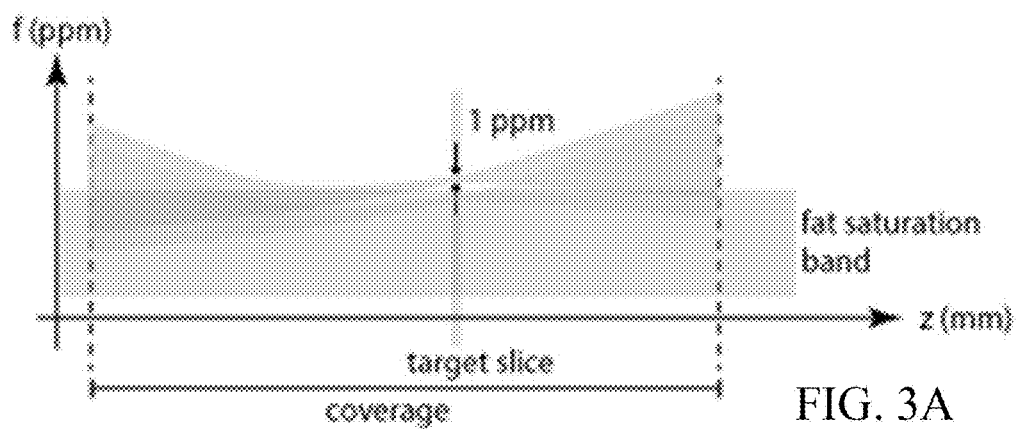
FIGS. 3A to 3C illustrate additional example of shimming for the volume of coverage as illustrated in FIG. 2.
Figure 3B:
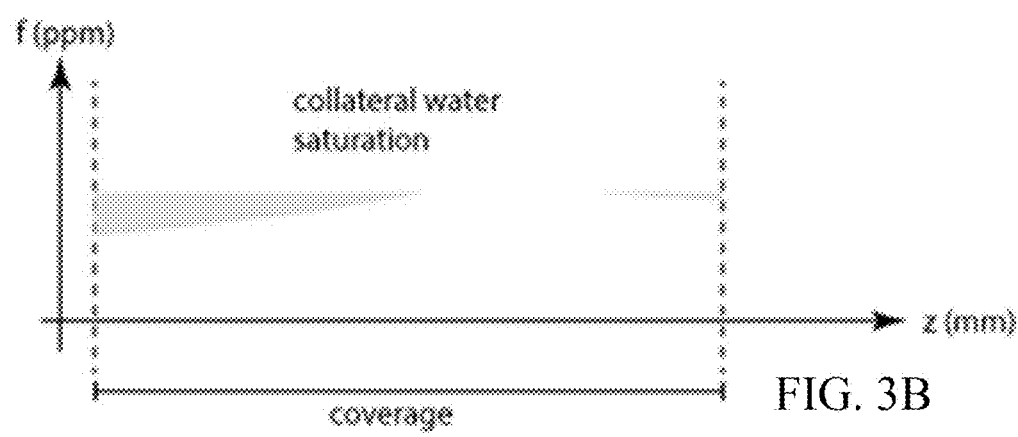

Referring to FIG. 3A, applying a fat saturation pulse effectively imposes a band of saturation after shimming for the target slice. Specifically, signals within the illustrated fat saturation band can be effectively nullified. As such, this fat saturation band, when implemented, effectively saturates fat signals within the target slice. At the same time, however, the saturation band also effectively nullifies water signals from outside the target slice but within the imaging volume because water signals from these regions fall under the saturation band. This nullification is illustrated in FIG. 3B, which shows fat saturation preparation pulses creating the fat saturation band shown in FIG. 3A that results in collateral water saturation outside of the target slice (but within the coverage region of the image volume). The fat saturation preparation pulses thus suppress water signals within the fat saturation band but outside the target slice. This unintended water saturation outside the target slice can degrade image quality in other slices within the coverage region. Indeed, the fat saturation preparation pulses are selective of frequency but not by spatial location. In this example, such a fat saturation pulse may not be designed to simultaneously saturate fat signal within the target slice and spare water signal within the coverage region.

Figure 3C:
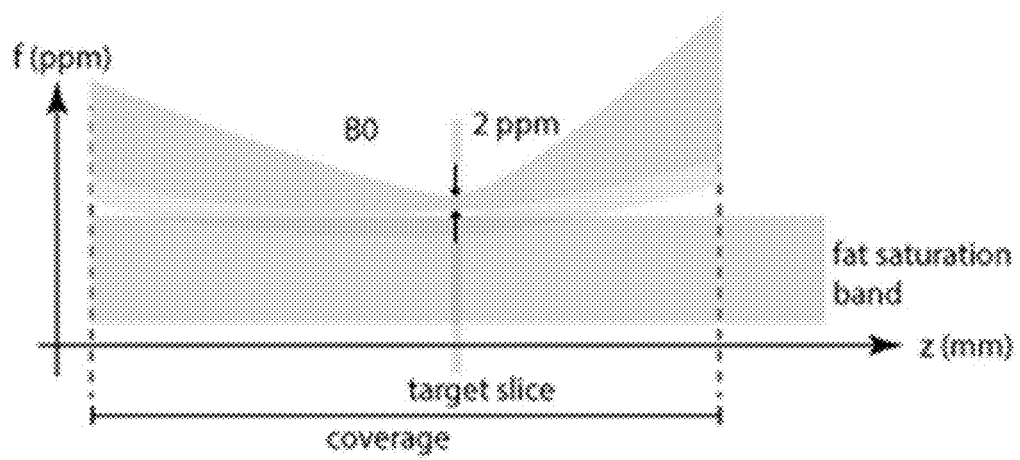

To mitigate the issue of unintended saturation, the MRI system 100 can be programmed to have one set of shim currents that drive shim coil assembly 109 while the fat saturation preparation pulses are played and use a different set of shim currents for the shim coils during imaging pulses when MR signals are being acquired from each selected slice. During the fat saturation preparation pulse, the shim currents are designed to alter the $B_0$ field inhomogeneity as shown in FIG. 3C. Here, the shimming currents may sacrifice some field homogeneity of the target slice (for example, an inhomogeneity of 2 ppm across the target slice but without collateral water saturation outside the target slice but within the coverage region) in order to move the water frequencies across the entire coverage region outside of the fat saturation band. In other words, the objective function of the shimming currents during this fat saturation phase is to maximize fat signals within the target slice while minimizing water signals within the entire range. This objective function is therefore not limited to optimizing a metric from the target slice alone. Generally speaking, the fat saturation region can be the union of all subsequent imaging slices (or volume of interest). After the fat saturation preparation pulses have been applied, the shim currents can change to a new setting to alter the field homogeneity across the target slice (for example, fine tuning the shimming currents to achieve an inhomogeneity of 1 ppm within the target slice).

Figure 4A:
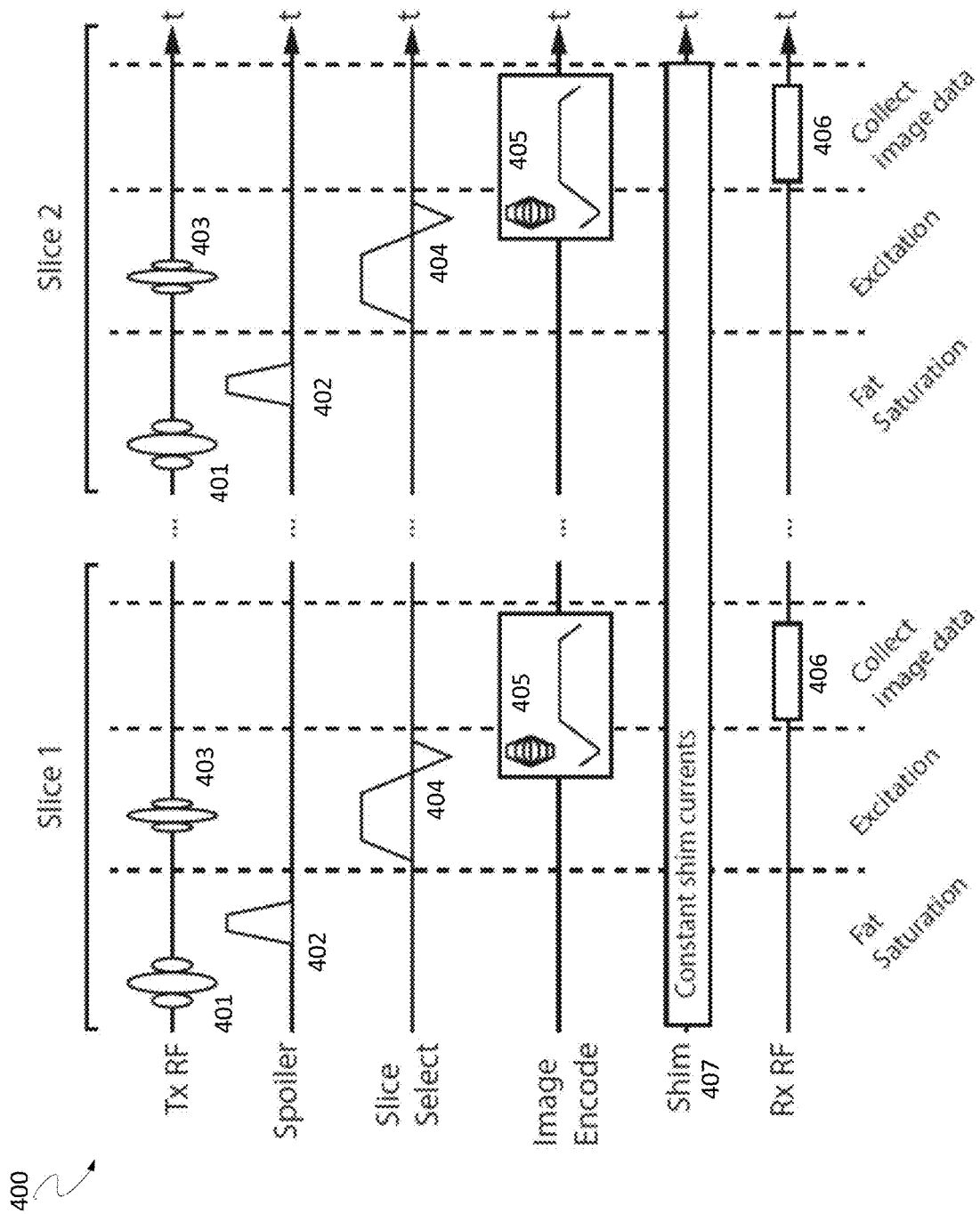
FIG. 4A to 4C illustrate examples of timing diagrams for performing MR imaging in accordance with some implementations.

Referring to FIG. 4A, an example of a timing diagram 400 for performing MR imaging is provided. Timing diagram 400 illustrates a pulse sequence for global shimming with spoiler gradient 402 following RF preparation pulse 401. Thereafter, RF transmitting pulse 403 is applied under slice selective pulse 404. Image encoding gradients 405 is subsequently applied to encode MR signals. The MR signals are received as signals 406 at the receiver coil. One set of constant shim currents 407 is set at the beginning of the scan and held during data acquisition for all imaging slices, for example, from slice 1 to slice 2.

Figure 4B:
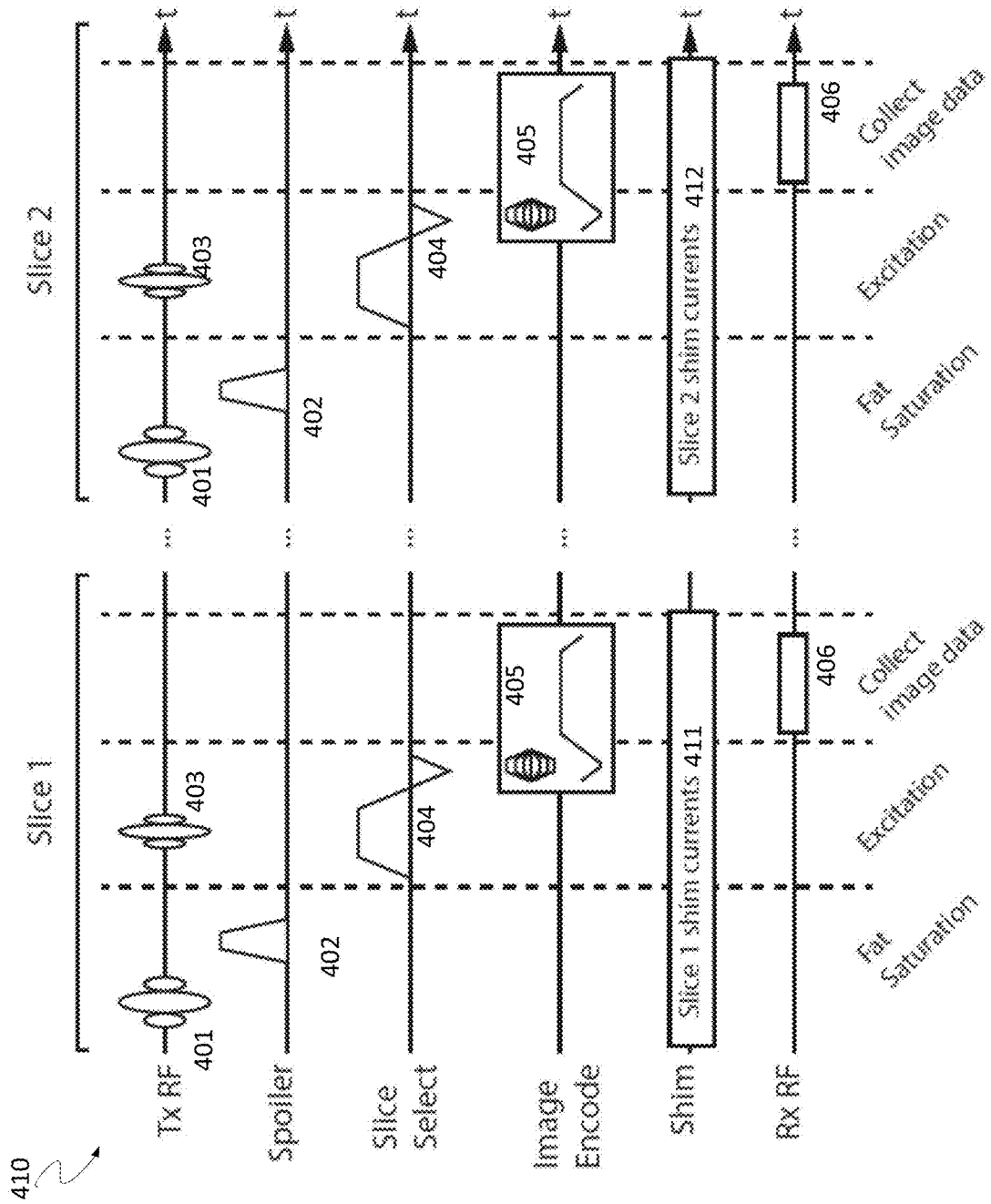

FIG. 4B shows an example of a timing diagram 410 of a pulse sequence for slice-by-slice dynamic shimming. Each slice is given its own set of shim currents. For example, shim currents 411 apply to slice 1 and shim currents 412 apply to slice 2. Here, the shim currents for a target slice are chosen to minimize $B_0$ inhomogeneity over the target slice.

Figure 4C:
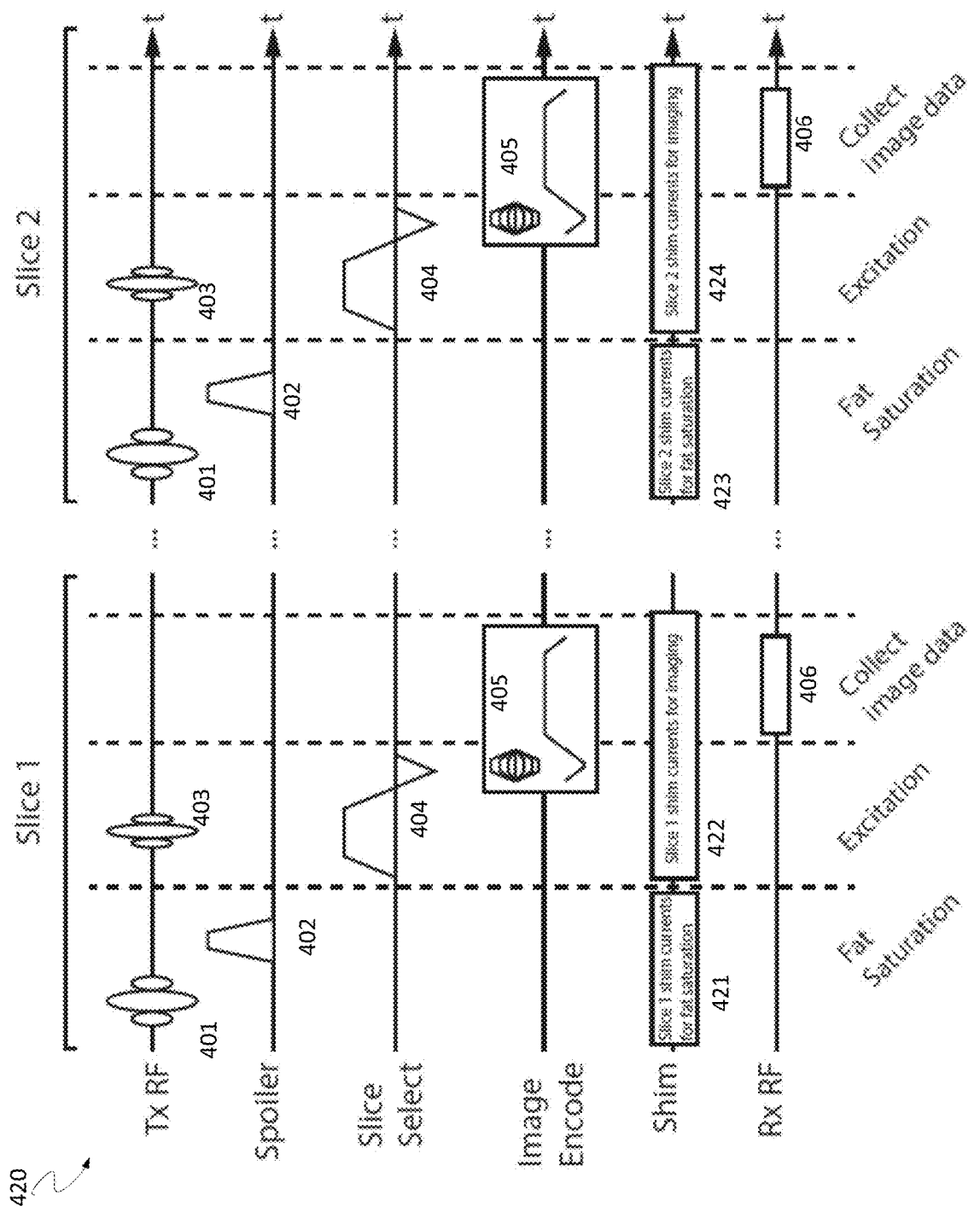

FIG. 4C shows another example of a timing diagram 420 of a pulse sequence according to some implementations. As discussed, during fat saturation preparation for slice 1, a first set of shim currents 421 may be applied to suppress fat signals from the target slice. The first set of shim currents 421 may not maximize fat suppression within the target slice. Yet, the first set of shim currents 421 may minimize water saturation, which is unintended, throughout the volume of interest as a whole. As noted, this minimization of water saturation within the whole volume may not correspond to maximization of fat saturation within a target slice. When the fat saturation preparation pulses are completed, the shim currents may transition to a second setting 422 that, for example, can result in a minimization of field inhomogeneity within the target slice for high-performance imaging. When imaging the next slice, for example, slice 2, a new set of shim currents 423 may be applied to suppress fat signals from the second target slice. Similar to shim currents 421, the shim currents 422 may not result in maximum fat suppression over the second target slice, yet may minimize water saturation over the volume of interest as a whole. After fat saturation and during imaging acquisition for slice 2, another set of shimming pulses 424 can be used, once again to minimize field homogeneity over the target slice.

A variety of MR imaging sequences can incorporate these signal acquisitions, including, for example, a gradient-echo pulse sequence, a spin-echo pulse sequence, a steady-state free precession (SSFP) pulse sequence, and an echo-planar imaging (EPI) pulse sequence. Moreover, when each slice-select gradient 412A, 412B, or 412C is applied, shim currents 401 may have transitioned from the first setting of 402 to a corresponding second setting. The exact timing may not be critical. In some cases, the transition may immediately precede slice-selection. In other cases, the transition may immediately follow slice-selection.

By way of examples, implementations can provide shim currents in the second setting that are substantially identical, even though the target slices are spatially different (for example, neighboring slices). The shim currents in the second setting can also vary by slice location as the second setting attempts to fine tune the $B_0$ magnetic field by corrections via high order harmonic terms through the shim coils. Moreover, several neighboring slices may form a slab or a composite volume for which a volumetric acquisition can be performed, for example, by an additional gradient waveform in the z direction. In other words, slice selection may involve selecting a slab with a three-dimensional signal acquisition for the slab.

In contrast to implementations that rely on spectro-spatial pulses, the implementations of the current specification does not use gradient coils only. Instead, the implementations of the current specification uses shim coils for correcting $B_0$ inhomogeneity. Indeed, other implementations treat the $B_0$ field as fixed and the optimization problem as an RF pulse only problem addressed by a spectrally selective RF pulse, or a spectrally selective RF pulse in combination with gradient waveforms. Moreover, the first set of shim currents of the present specification may result in fat saturation preparation pulses of similar duration as compared to a typical spectrally selective fat saturation (FatSat) pulse. In contrast, spectro-spatial pulses can result in significantly longer pulses and may not be appropriate in many imaging applications. Although the examples discussed above in the present specification is contrasted with spectro-spatial pulses, it is understood that the above examples and spectro-spatial pulses are not mutually exclusive techniques. In particular, the above examples can incorporate the use of spectro-spatial pulses with the potential for further improvement in FatSat quality, at the expense of longer FatSat pulse durations.

Implementations disclosed by the present specification are not limited to MRI systems with a small-bore magnet (for example, not large enough for whole body scanning) or a low-field magnet (for example, lower than 1.5 Tesla). In fact, these implementations are equally applicable to MRI systems with a large-bore magnet (for example, accommodating whole body scanning) or a high-field magnet (for example, no lower than 1.5 Tesla).

Moreover, sets of shimming currents can be computed for magnetic resonance imaging (MRI) system 100 having a main magnet that provides a magnetic field $B_0$ in inner bore 101. Initially, a field map of the magnetic field $B_0$ can be obtained. For example, a field map can be calculated based on the difference in phase between two different echoes in a double echo sequence. Additionally or alternatively, two separate acquisitions with opposite phase encoding directions can be used to calculate a field map based on the difference in distortion between the two acquisitions. Thereafter, a fat map of a portion of a subject placed in the main magnet (for example, inner bore 101) can be obtained. This fat map can be obtained by globally suppressing water signals. Likewise, a water map of the portion of the subject placed in the main magnet (for example, inner bore 101) can also be obtained by globally suppressing fat signals. In some cases, the fat map, the water map, and the field map may be jointly obtained using a chemical shift encoded method. In some cases, the fat map and the water map can be obtained as fractional maps (for example, based on the Dixon method to extract in-phase and out-of-phase signals). Based on the field map, the fat map, and the water map, values of a first set of shimming currents that substantially minimize water saturation while providing adequate fat saturation within a region that covers the portion of the subject can be obtained. Subsequently, location information of a first imaging volume of interest, the first imaging volume of interest included by the region can be obtained. Based on the field map, the fat map, the water map, and the location information of the first imaging volume of interest, values of a second set of shimming currents can be computed that substantially minimize field inhomogeneities within the first imaging volume of interest.

As used herein, the terms "comprises" and "comprising" are to be construed as being inclusive and open ended, and not exclusive. Specifically, when used in the specification and claims, the terms "comprises" and "comprising" and variations thereof mean the specified features, steps or components are included. These terms are not to be interpreted to exclude the presence of other features, steps or components.

As used herein, the term "exemplary" means "serving as an example, instance, or illustration," and should not be construed as preferred or advantageous over other configurations disclosed herein.

As used herein, the terms "about" and "approximately" are meant to cover variations that may exist in the upper and lower limits of the ranges of values, such as variations in properties, parameters, and dimensions. In one non-limiting example, the terms "about" and "approximately" mean plus or minus 10 percent or less.

The specific embodiments described above have been shown by way of example, and it should be understood that these embodiments may be susceptible to various modifications and alternative forms. It should be further understood that the claims are not intended to be limited to the particular forms disclosed, but rather to cover all modifications, equivalents, and alternatives falling within the spirit and scope of this specification.

What is claimed is:

1. A method to perform fat saturation on a magnetic resonance imaging (MRI) system having a main magnet providing a magnetic field $B_0$, the method comprising:
    driving a shim coil assembly of the MRI system with a first set of shimming currents to sufficiently alter a $B_0$ field inhomogeneity of the magnetic field $B_0$ within a region that includes a first imaging volume of interest such that water saturation inside the region is reduced from before the first set of shimming currents are applied;
    applying a fat saturation pulse to the region;
    identifying the first imaging volume of interest from the region;
    driving the shim coil assembly of the MRI system with a second set of shimming currents to alter the $B_0$ field inhomogeneity of the magnetic field $B_0$ within the first imaging volume of interest such that the $B_0$ field inhomogeneity within the first imaging volume of interest is reduced from before the second set of shimming currents were applied; and
    obtaining magnetic resonance (MR) signals from the first imaging volume of interest using an imaging pulse sequence.

2. The method of claim 1, wherein obtaining magnetic resonance signals from the first imaging volume of interest comprises:
    applying gradient pulses to encode MR signals from the first imaging volume of interest; and
    in response to the gradient pulses, acquiring the MR signals from the first imaging volume of interest.

3. The method of claim 1, wherein the imaging pulse sequence comprises at least one of: a gradient-echo pulse sequence, a spin-echo pulse sequence, a steady-state free precession (SSFP) pulse sequence, and an echo-planar imaging (EPI) pulse sequence.

4. The method of claim 1, wherein driving the shim coil assembly of the MRI system with a first set of shimming currents comprises: driving the shim coil assembly of the MRI system with a first set of shimming currents to substantially minimize water saturation within the region.

5. The method of claim 1, further comprising:
    identifying a second imaging volume of interest from the region;
    subsequently driving the shim coil assembly of the MRI system with a third set of shimming currents to alter the $B_0$ field inhomogeneity of the magnetic field $B_0$ within the second imaging volume of interest such that the $B_0$ field inhomogeneity within the second imaging volume of interest is reduced from before the third set of shimming currents were applied; and
    obtaining magnetic resonance signals from the second imaging volume of interest using the imaging pulse sequence.

6. The method of claim 1, further comprising:
    placing a subject in the main magnet such that the region covers a portion of the subject.

7. The method of claim 6, wherein the portion of the subject includes at least one of:
    an abdominal organ of the subject, a breast of the subject, a neck of the subject, an extremity of the subject, and a head of the subject.

8. The method of claim 1, wherein prior to obtaining the MR signals from the first imaging volume of interest:
    applying a first slice-select gradient while applying a first radio-frequency (RF) pulse such that protons from the first imaging volume of interest are excited by the first RF pulse.

9. A magnetic resonance imaging (MRI) system, comprising:
    a main magnet providing a magnetic field $B_0$;
    a shim coil assembly;
    a gradient coil assembly;
    a radio-frequency (RF) coil;
    a controller in communication with the shim coil assembly, the gradient coil assembly, and the RF coil, the controller configured to perform operations of:
        driving the shim coil assembly of the MRI system with a first set of shimming currents to sufficiently alter a $B_0$ field inhomogeneity of the magnetic field $B_0$ within a region that includes a first imaging volume of interest such that water saturation inside the region is reduced from before the first set of shimming currents are applied;
        applying a fat saturation pulse to the region;
        identifying the first imaging volume of interest from the region;
        driving the shim coil assembly of the MRI system with a second set of shimming currents to alter the $B_0$ field inhomogeneity of the magnetic field $B_0$ within the first imaging volume of interest such that the $B_0$ field inhomogeneity within the first imaging volume of interest is reduced from before the second set of shimming currents were applied; and obtaining magnetic resonance (MR) signals from the first imaging volume of interest using an imaging pulse sequence.

10. The MRI system of claim 9, wherein obtaining magnetic resonance signals from the first imaging volume of interest comprises:

applying gradient pulses to encode MR signals from the first imaging volume of interest; and in response to the gradient pulses, acquiring the MR signals from the first imaging volume of interest.

11. The MRI system of claim 9, wherein the imaging pulse sequence comprises at least one of: a gradient-echo pulse sequence, a spin-echo pulse sequence, a steady-state free precession (SSFP) pulse sequence, and an echo-planar imaging (EPI) pulse sequence.

12. The MRI system of claim 9, wherein driving the shim coil assembly of the MRI system with a first set of shimming currents comprises: driving the shim coil assembly of the MRI system with a first set of shimming currents to substantially minimize water saturation within the region.

13. The MRI system of claim 9, wherein the operations further comprise:

identifying a second imaging volume of interest from the region;

subsequently driving the shim coil assembly of the MRI system with a third set of shimming currents to alter the $B_0$ field inhomogeneity of the magnetic field $B_0$ within the second imaging volume of interest such that the $B_0$ field inhomogeneity within the second imaging volume of interest is reduced from before the third set of shimming currents were applied; and obtaining magnetic resonance signals from the second imaging volume of interest using the imaging pulse sequence.

14. The MRI system of claim 9, wherein the region covers a portion of a subject placed in the main magnet.

15. The MRI system of claim 14, wherein the portion of the subject includes at least one of:

an abdominal organ of the subject, a breast of the subject, a neck of the subject, an extremity of the subject, and a head of the subject.

16. The MRI system of claim 9, wherein prior to obtaining the MR signals from the first imaging volume of interest: applying a first slice-select gradient while applying a first radio-frequency (RF) pulse such that protons from the first imaging volume of interest are excited by the first RF pulse.

17. A method to compute sets of shimming currents for a magnetic resonance imaging (MRI) system having a main magnet that provides a magnetic field $B_0$, the method comprising:

obtaining a field map of a portion of the magnetic field $B_0$;

based on the field map, computing values of a first set of shimming currents that substantially minimize water saturation within a region that covers a portion of a subject placed in the main magnet;

obtaining location information of a first imaging volume of interest, the first imaging volume of interest included by the region; and based on the field map, and the location information of the first imaging volume of interest, computing values of a second set of shimming currents that substantially minimize magnetic field inhomogeneity within the first imaging volume of interest.

18. The method of claim 17, further comprising:

obtaining a fat map of the portion of the subject placed in the main magnet; and obtaining a water map of the portion of the subject placed in the main magnet.

19. The method of claim 18, wherein the values of a first and second sets of shimming currents are computed based on the field map, the fat map, and the water map.

20. The method of claim 17, wherein the first set of shimming currents substantially maximize fat saturation within the region that covers the portion of the subject.

* * * * *